US009336854B2

(12) United States Patent
Ko

(10) Patent No.: US 9,336,854 B2
(45) Date of Patent: May 10, 2016

(54) SEMICONDUCTOR MEMORY APPARATUS

(71) Applicant: SK hynix Inc., Icheon-si Gyeonggi-do (KR)

(72) Inventor: Jae Bum Ko, Icheon-si (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 0 days.

(21) Appl. No.: 14/505,140

(22) Filed: Oct. 2, 2014

(65) Prior Publication Data

US 2015/0340079 A1 Nov. 26, 2015

(30) Foreign Application Priority Data

May 21, 2014 (KR) ........................ 10-2014-0060903

(51) Int. Cl.
*G11C 8/08* (2006.01)
*G11C 11/406* (2006.01)
*G11C 11/4093* (2006.01)

(52) U.S. Cl.
CPC ...... *G11C 11/40618* (2013.01); *G11C 11/4093* (2013.01); *G11C 11/40611* (2013.01)

(58) Field of Classification Search
CPC ................................ G11C 8/08; G11C 11/406
USPC ............................................. 365/222, 230.06
See application file for complete search history.

(56) References Cited

U.S. PATENT DOCUMENTS 8,222,942 B2 * 7/2012 Lee ...................... G11C 11/406 327/198
8,797,781 B2 * 8/2014 Tanaka ..................... G11C 8/08 365/205
8,854,910 B2 * 10/2014 Park ................. G11C 11/40615 365/222
8,953,403 B1 * 2/2015 Song ................ G11C 11/40618 365/222
9,129,704 B2 * 9/2015 Lee ...................... G11C 11/401
2006/0133168 A1 * 6/2006 Kwack ................. G11C 11/406 365/203
2006/0146626 A1 * 7/2006 Lee ...................... G11C 11/406 365/222
2009/0279373 A1 * 11/2009 Han ..................... G11C 11/406 365/222
2009/0303816 A1 * 12/2009 Cho ......................... G11C 8/12 365/200
2012/0163111 A1 * 6/2012 Shim ........................ G11C 7/04 365/222
2012/0195150 A1 * 8/2012 Park ..................... G11C 11/408 365/222
2012/0256663 A1 * 10/2012 Lee ...................... G11C 11/406 327/142
2013/0201777 A1 * 8/2013 Shin ................. G11C 11/40618 365/222
2014/0140150 A1 * 5/2014 Kang ..................... G11C 7/222 365/194
2015/0043293 A1 * 2/2015 Song ................ G11C 11/40618 365/222

FOREIGN PATENT DOCUMENTS

KR 1020130024158 A 3/2013

* cited by examiner

*Primary Examiner* — Michael Tran
(74) *Attorney, Agent, or Firm* — William Park & Associates Ltd.

(57) ABSTRACT

A semiconductor memory apparatus may include an active control portion configured to generate a preliminary bank active signal and a single bank refresh signal in response to a command, a refresh control signal, and a bank active signal. The semiconductor memory apparatus may also include a signal combination portion configured to enable the bank active signal when either the preliminary bank active signal or the single bank refresh signal is enabled.

19 Claims, 7 Drawing Sheets

140
141
VDD
PCG
T4
IV11
IV10
ND6
IV12
SB_REF<0>
REFACT
BA<0>
ND5
IV9
T3
ACT_pre<0>
VSS
142
2ND SINGLE BANK REFRESH SIGNAL OUTPUT PART
SB_REF<1>
143
3RD SINGLE BANK REFRESH SIGNAL OUTPUT PART
SB_REF<2>
144
4TH SINGLE BANK REFRESH SIGNAL OUTPUT PART
SB_REF<3>
145
5TH SINGLE BANK REFRESH SIGNAL OUTPUT PART
SB_REF<4>
146
6TH SINGLE BANK REFRESH SIGNAL OUTPUT PART
SB_REF<5>
147
7TH SINGLE BANK REFRESH SIGNAL OUTPUT PART
SB_REF<6>
148
8TH SINGLE BANK REFRESH SIGNAL OUTPUT PART
SB_REF<7>

SEMICONDUCTOR MEMORY APPARATUS

CROSS-REFERENCES TO RELATED APPLICATION

The present application claims priority under 35 U.S.C. §119(a) to Korean application number 10-2014-0060903, filed on May 21, 2014, in the Korean Intellectual Property Office, which is incorporated herein by reference in its entirety as set forth in full.

BACKGROUND

1. Technical Field

Various embodiments generally relate to a semiconductor integrated circuit, and more particularly, to a semiconductor memory apparatus.

2. Related Art

Semiconductor memory apparatuses may store data, and output the stored data. Semiconductor memory apparatuses may be categorized as either volatile memory or non-volatile memory.

Unlike non-volatile memory, volatile memory may perform a particular operation in order to retain the stored data. For example, semiconductor memory apparatuses, which include memory cells that include capacitors and transistors, may periodically perform a refresh operation in order to retain the stored data.

SUMMARY

In an embodiment, a semiconductor memory apparatus may include an active control portion configured to generate a preliminary bank active signal and a single bank refresh signal in response to a command, a refresh control signal, and a bank active signal. The semiconductor memory apparatus may also include a signal combination portion configured to enable the bank active signal when either the preliminary bank active signal or the single bank refresh signal is enabled.

In an embodiment, a semiconductor memory apparatus may include a plurality of banks, and an active control portion configured to select either a refresh operation or an active operation in response to a command, configured to select either an all bank refresh operation or a single bank refresh operation in response to a refresh control signal during the refresh operation, and configured to prevent performing the all bank refresh operation when one or more of the plurality of banks are activated.

In an embodiment, a semiconductor memory apparatus may include a bank active control unit configured to generate a preliminary bank active signal in response to a bank address during an active operation. The semiconductor memory apparatus may also include a single bank refresh control unit configured to select a single bank according to the bank address, enable a single bank refresh signal when the single bank is to be refreshed, and wherein the single bank refresh control unit disables the single bank refresh signal when the single bank to be refreshed is activated. The preliminary bank active signal may activate a bank, and the single bank refresh signal may command a refresh operation.

DETAILED DESCRIPTION

Hereinafter, a semiconductor apparatus according to various embodiments will be described below with reference to the accompanying drawings.

Figure 1:
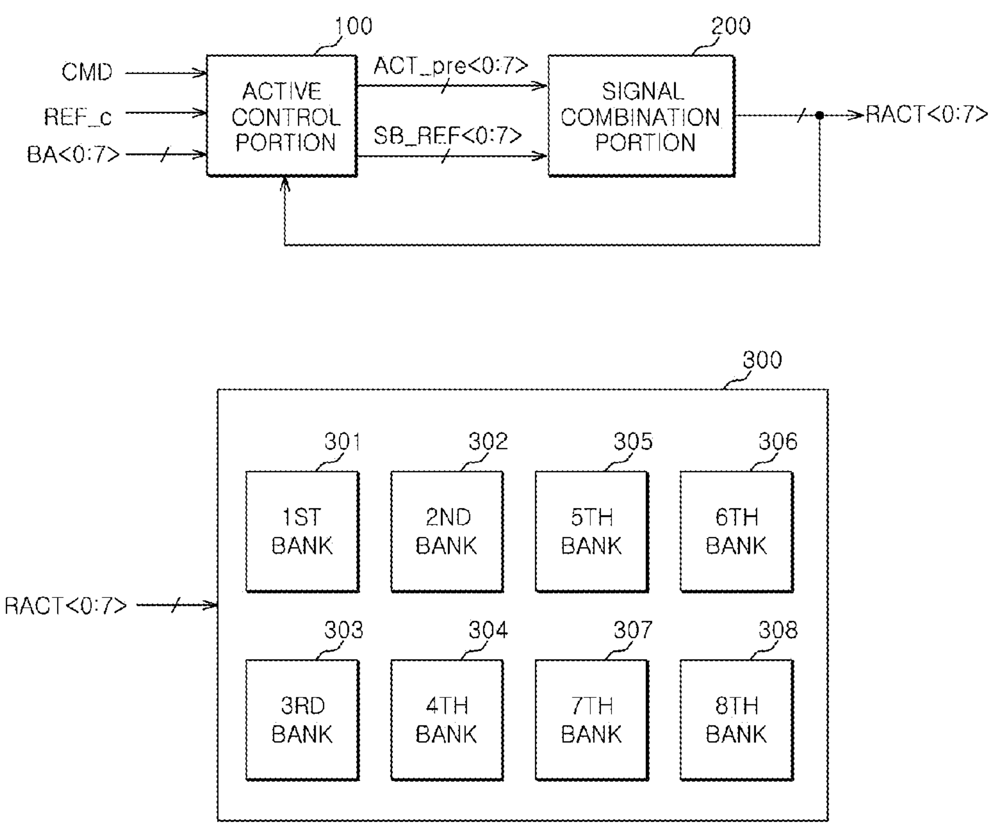
FIG. 1 is a block diagram illustrating a representation of a semiconductor memory apparatus in accordance with an embodiment.

Referring to FIG. 1, the semiconductor memory apparatus in accordance with an example of an embodiment of the present disclosure may include an active control portion 100, a signal combination portion 200, and a bank group 300.

The active control portion 100 may generate first to eighth preliminary bank active signals ACT_pre<0:7> in response to a command CMD signal, a refresh control signal REF_c, first to eighth bank addresses BA<0:7>, and first to eighth bank active signals RACT<0:7>. The active control portion 100 may generate first to eighth single bank refresh signals SB_REF<0:7> in response to a command CMD signal, a refresh control signal REF_c, first to eighth bank addresses BA<0:7>, and first to eighth bank active signals RACT<0:7>. For example, the active control portion 100 may select a refresh operation, an active operation, and a precharge operation in response to the command CMD signal. During the refresh operation, the active control portion 100 may select either an all bank refresh operation or a single bank refresh operation in response to the refresh control signal REF_c, and may prevent performing the all bank refresh operation when one or more of a plurality of banks 301 to 308 are activated. Also, during the single bank refresh operation, the active control portion 100 may perform the single bank refresh operation when an activated bank of the plurality of the banks, and a bank to be refreshed among the plurality of the banks are different from each other; and may prevent performing the single bank refresh operation when an activated one of the plurality of the banks, and a bank to be refreshed among the plurality of the banks are the same. For a more detailed description, the active control portion 100 may select either the all bank refresh operation or the single bank refresh operation in response to the refresh control signal REF_c when the command CMD signal, which makes the semiconductor memory apparatus to perform the refresh operation, is inputted. The active control portion 100 may generate the first to eighth preliminary bank active signals ACT_pre<0:7>, or the first to eighth single bank refresh signals SB_REF<0:7> according to the result of the selection. The active control portion 100 may generate the first to eighth preliminary bank active signals ACT_pre<0:7> during the all bank refresh operation, and the first to eighth single bank refresh signals SB_REF<0:7> during the single bank refresh operation. While generating the first to eighth preliminary bank active signals ACT_pre<0:7> during the all bank refresh operation, the active control portion 100 may halt generating the first to eighth preliminary bank active signals ACT_pre<0:7>, and thus the first to eighth preliminary bank active signals ACT_ pre<0:7> may not be generated when one or more of the first to eighth bank active signals RACT<0:7> are enabled. The active control portion 100 may generate the first to eighth single bank refresh signals SB_REF<0:7> in response to the first to eighth bank addresses BA<0:7> during the single bank refresh operation. When a bank to be refreshed by corresponding one of the first to eighth single bank refresh signals SB_REF<0:7> is already activated, the active control portion 100 may halt generating the corresponding one of the first to eighth single bank refresh signals SB_REF<0:7>.

The signal combination portion 200 may enable the first to eighth bank active signals RACT<0:7> when one or more of the first to eighth preliminary bank active signals ACT_pre<0:7> are enabled and/or when one or more of the first to eighth single bank refresh signals SB_REF<0:7> are enabled. For example, the signal combination portion 200 may enable the first bank active signal RACT<0> when both the first preliminary bank active signal ACT_pre<0> and the first single bank refresh signal SB_REF<0> are enabled, or when one of the signals, i.e., the first preliminary bank active signal ACT_pre<0> and the first single bank refresh signal SB_REF<0>, is enabled. The signal combination portion 200 may enable the second bank active signal RACT<1> when both the second preliminary bank active signal ACT_pre<1> and the second single bank refresh signal SB_REF<1> are enabled, or when one of the signals, i.e., the second preliminary bank active signal ACT_pre<1> and the second single bank refresh signal SB_REF<1>, is enabled. The signal combination portion 200 may enable the third bank active signal RACT<2> when both the third preliminary bank active signal ACT_pre<2> and the third single bank refresh signal SB_REF<2> are enabled, or when one of the signals, i.e., the third preliminary bank active signal ACT_pre<2> and the third single bank refresh signal SB_REF<2>, is enabled. The signal combination portion 200 may enable the fourth bank active signal RACT<3> when both the fourth preliminary bank active signal ACT_pre<3> and the fourth single bank refresh signal SB_REF<3> are enabled, or when one of the signals, i.e., the fourth preliminary bank active signal ACT_pre<3> and the fourth single bank refresh signal SB_REF<3>, is enabled. The signal combination portion 200 may enable the fifth bank active signal RACT<4> when both the fifth preliminary bank active signal ACT_pre<4> and the fifth single bank refresh signal SB_REF<4> are enabled, or when one of the signals, i.e., the fifth preliminary bank active signal ACT_pre<4> and the fifth single bank refresh signal SB_REF<4>, is enabled. The signal combination portion 200 may enable the sixth bank active signal RACT<5> when both the sixth preliminary bank active signal ACT_pre<5> and the sixth single bank refresh signal SB_REF<5> are enabled, or when one of the signals, i.e., the sixth preliminary bank active signal ACT_pre<5> and the sixth single bank refresh signal SB_REF<5>, is enabled. The signal combination portion 200 may enable the seventh bank active signal RACT<6> when both the seventh preliminary bank active signal ACT_pre<6> and the seventh single bank refresh signal SB_REF<6> are enabled, or when one of the signals, i.e., the seventh preliminary bank active signal ACT_pre<6> and the seventh single bank refresh signal SB_REF<6>, is enabled. The signal combination portion 200 may enable the eighth bank active signal RACT<7> when both the eighth preliminary bank active signal ACT_pre<7> and the eighth single bank refresh signal SB_REF<7> are enabled, or when one of the signals, i.e., the eighth preliminary bank active signal ACT_pre<7> and the eighth single bank refresh signal SB_REF<7>, is enabled. The signal combination portion 200 may comprise an OR gate.

The bank group 300 may include first to eighth banks 301, 302, 303, 304, 305, 306, 307, and 308. The banks 301 to 308 may be selectively activated in response to the first to eighth bank active signals RACT<0:7>. The first bank 301 may be activated when the first bank active signal RACT<0> is enabled. The second bank 302 may be activated when the second bank active signal RACT<1> is enabled. The third bank 303 may be activated when the third bank active signal RACT<2> is enabled. The fourth bank 304 may be activated when the fourth bank active signal RACT<3> is enabled. The fifth bank 305 may be activated when the fifth bank active signal RACT<4> is enabled. The sixth bank 306 may be activated when the sixth bank active signal RACT<5> is enabled. The seventh bank 307 may be activated when the seventh bank active signal RACT<6> is enabled. The eighth bank 308 may be activated when the eighth bank active signal RACT<7> is enabled.

Figure 2:
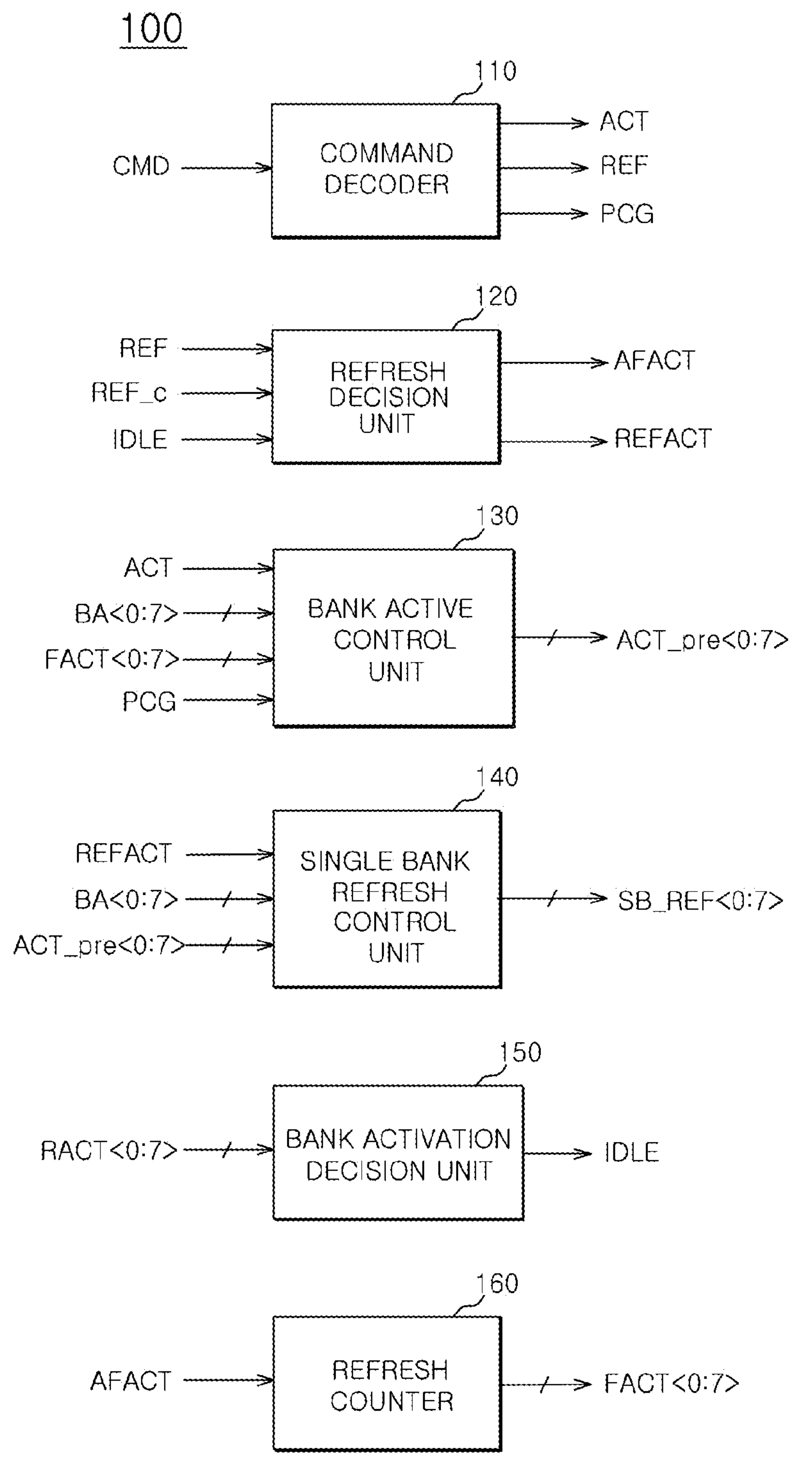
FIG. 2 is a block diagram illustrating a representation of an active control portion illustrated in FIG. 1.

Referring to FIG. 2, the active control portion 100 may include a command decoder 110, a refresh decision unit 120, and a bank active control unit 130. The active control portion 100 may also include a single bank refresh control unit 140, a bank activation decision unit 150, and a refresh counter 160.

The command decoder 110 may generate an active signal ACT, a refresh signal REF, and a precharge signal PCG in response to the command CMD signal. For example, the command decoder 110 may decode the command CMD, may enable the active signal ACT during the active operation, may enable the refresh signal REF during the refresh operation, and may enable the precharge signal PCG during the precharge operation.

The refresh decision unit 120 may enable either an all bank refresh command signal AFACT or a single bank refresh command signal REFACT in response to the following three signals: the refresh signal REF; the refresh control signal REF_c; and an idle signal IDLE. For example, the refresh decision unit 120 may select either the all bank refresh operation or the single bank refresh operation in response to the refresh signal REF, and the refresh control signal REF_c, and may perform the all bank refresh operation or the single bank refresh operation according to the result of the decision. When the refresh decision unit 120 selects the all bank refresh operation, the refresh decision unit 120 may decide whether or not to perform the all bank refresh operation in response to the idle signal IDLE. In further detail, the refresh decision unit 120 may enable the all bank refresh command signal AFACT when the refresh signal REF, the refresh control signal REF_c, and the idle signal IDLE are all enabled. The refresh decision unit 120 may disable the all bank refresh command signal AFACT when the refresh signal REF and the refresh control signal REF_c are both enabled, and the idle signal IDLE is disabled. When the all bank refresh command signal AFACT is disabled during the refresh operation, the first to eighth preliminary bank active signals ACT_pre<0:7> may be prevented from being enabled. The refresh decision unit 120 may enable the single bank refresh command signal REFACT when the refresh signal REF is enabled, and the refresh control signal REF_c is disabled.

The bank active control unit 130 may generate the first to eighth preliminary bank active signals ACT_pre<0:7> in response to the following signals: the active signal ACT; the first to eighth bank addresses BA<0:7>; first to eighth refresh counting signals FACT<0:7>; and the precharge signal PCG. For example, the bank active control unit 130 may generate the first to eighth preliminary bank active signals ACT_pre<0:7> in response to the first to eighth bank addresses BA<0:7> during the active operation. In further detail, the bank active control unit 130 may latch and output the first to eighth bank addresses BA<0:7> as the first to eighth preliminary bank active signals ACT_pre<0:7> when the active signal ACT is enabled. Also, the bank active control unit 130 may generate the first to eighth preliminary bank active signals ACT_pre<0:7> in response to the first to eighth refresh counting signals FACT<0:7> during the refresh operation. In further detail, the bank active control unit 130 may latch and output the first to eighth refresh counting signals FACT<0:7>, which are generated during the all bank refresh operation, as the first to eighth preliminary bank active signals ACT_pre<0:7>.

The single bank refresh control unit 140 may generate the first to eighth single bank refresh signals SB_REF<0:7> in response to the single bank refresh command signal REFACT, the first to eighth bank addresses BA<0:7>, and the first to eighth preliminary bank active signals ACT_pre<0:7>. For example, the single bank refresh control unit 140 may latch and output the first to eighth bank addresses BA<0:7> as the first to eighth single bank refresh signals SB_REF<0:7> when the single bank refresh command signal REFACT is enabled. The single bank refresh control unit 140 may prevent the output of the first to eighth single bank refresh signals SB_REF<0:7> in response to the first to eighth preliminary bank active signals ACT_pre<0:7>. In further detail, the single bank refresh control unit 140 may prevent the output of the first single bank refresh signal SB_REF<0>, and the first single bank refresh signal SB_REF<0> may be disabled when the first preliminary bank active signal ACT_pre<0> is enabled. The single bank refresh control unit 140 may prevent the output of the second single bank refresh signal SB_REF<1>, and the second single bank refresh signal SB_REF<1> may be disabled when the second preliminary bank active signal ACT_pre<1> is enabled. The single bank refresh control unit 140 may prevent the output of the third single bank refresh signal SB_REF<2>, and the third single bank refresh signal SB_REF<2> may be disabled when the third preliminary bank active signal ACT_pre<2> is enabled. The single bank refresh control unit 140 may prevent the output of the fourth single bank refresh signal SB_REF<3>, and the fourth single bank refresh signal SB_REF<3> may be disabled when the fourth preliminary bank active signal ACT_pre<3> is enabled. The single bank refresh control unit 140 may prevent the output of the fifth single bank refresh signal SB_REF<4>, and the fifth single bank refresh signal SB_REF<4> may be disabled when the fifth preliminary bank active signal ACT_pre<4> is enabled. The single bank refresh control unit 140 may prevent the output of the sixth single bank refresh signal SB_REF<5>, and the sixth single bank refresh signal SB_REF<5> may be disabled when the sixth preliminary bank active signal ACT_pre<5> is enabled. The single bank refresh control unit 140 may prevent the output of the seventh single bank refresh signal SB_REF<6>, and the seventh single bank refresh signal SB_REF<6> may be disabled when the seventh preliminary bank active signal ACT_pre<6> is enabled.

The bank activation decision unit 150 may disable the idle signal IDLE when one or more of the banks 301 to 308 (see FIG. 1) are activated. The bank activation decision unit 150 may enable the idle signal IDLE when all of the banks 301 to 308 are deactivated. For example, the bank activation decision unit 150 may disable the idle signal IDLE when one or more of the first to eighth bank active signals RACT<0:7> are enabled. The bank activation decision unit 150 may enable the idle signal IDLE when all of the first to eighth bank active signals RACT<0:7> are disabled.

The refresh counter 160 may generate the first to eighth refresh counting signals FACT<0:7> in response to the all bank refresh command signal AFACT. For example, the refresh counter 160 may count the first to eighth refresh counting signals FACT<0:7> when the all bank refresh command signal AFACT is enabled. That is, for example, the refresh counter 160 may sequentially enable the first to eighth refresh counting signals FACT<0:7> when the all bank refresh command signal AFACT is enabled.

Figure 3:
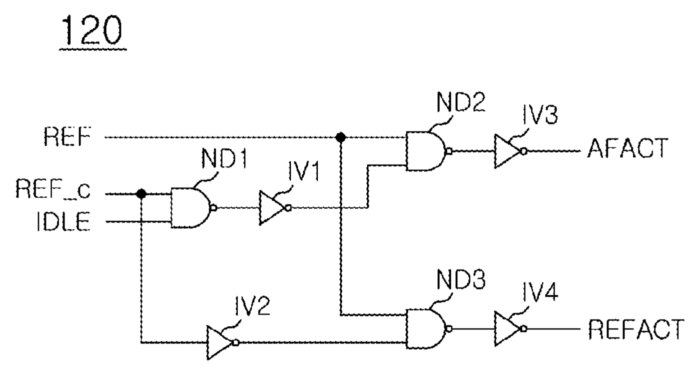
FIG. 3 is a circuit diagram illustrating a representation of a refresh decision unit illustrated in FIG. 2.

Referring to FIG. 3, the refresh decision unit 120 may include first to third NAND gates ND1, ND2, and ND3. The refresh decision unit 120 may also include first to fourth inverters IV1, IV2, IV3, and IV4. The first NAND gate ND1 may receive the refresh control signal REF_c and the idle signal IDLE. The first inverter IV1 may receive the output of the first NAND gate ND1. The second NAND gate ND2 may receive the output of the first inverter IV1 and the refresh signal REF. The second inverter IV2 may receive the refresh control signal REF_c. The third NAND gate ND3 may receive the refresh signal REF and the output of the second inverter IV2. The third inverter IV3 may receive the output of the second NAND gate ND2, and may output the all bank refresh command signal AFACT. The fourth inverter IV4 may receive the output of the third NAND gate ND3, and may output the single bank refresh command signal REFACT.

Figure 4:
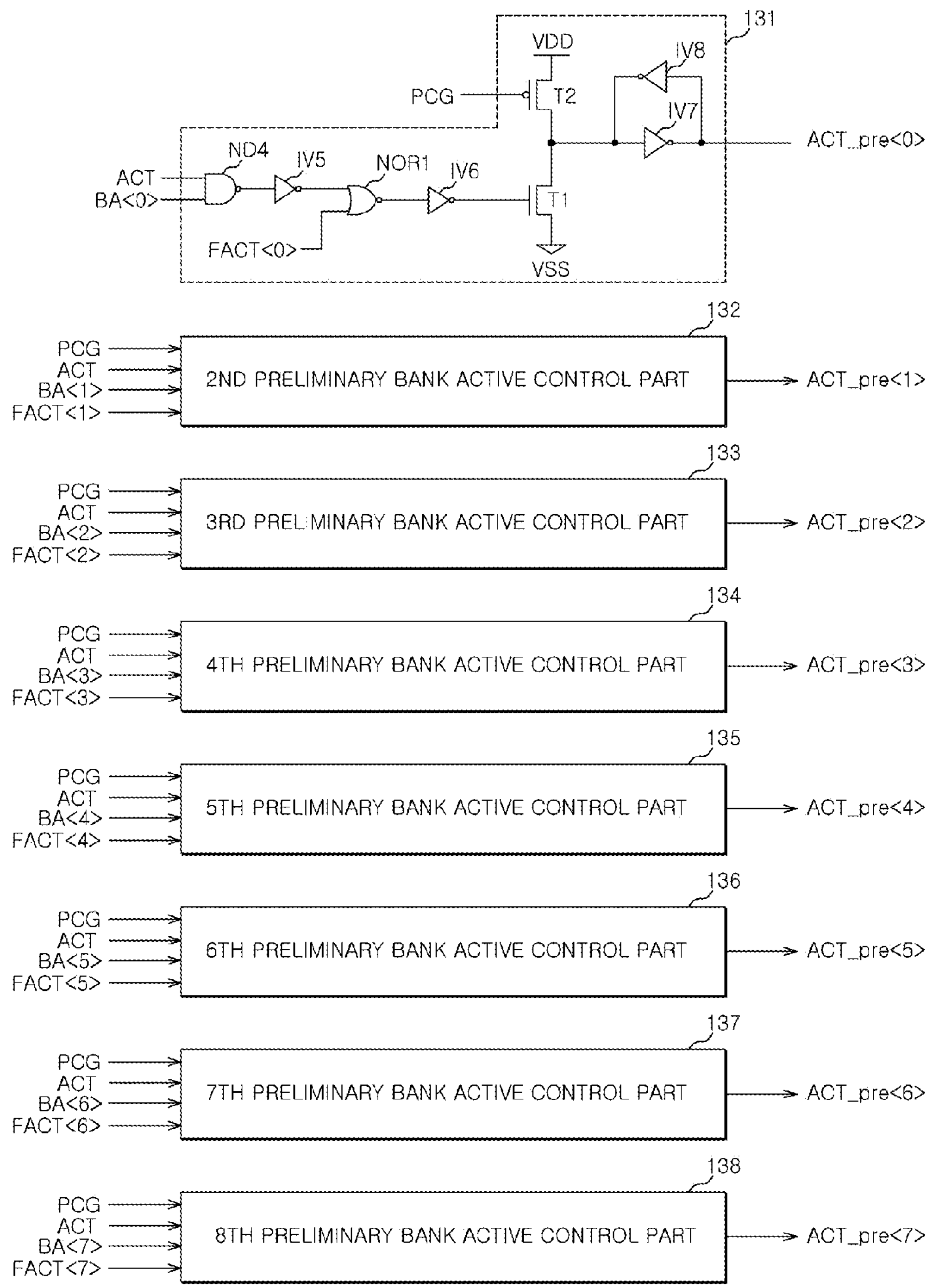
FIG. 4 is circuit diagram illustrating a representation of a bank active control unit illustrated in FIG. 2.

Referring to FIG. 4, the bank active control unit 130 may include first to eighth preliminary bank active control parts 131, 132, 133, 134, 135, 136, 137, and 138. The first to eighth preliminary bank active control parts 131 to 138 may be substantially the same and may operate substantially the same except that the input and output signals may differ (i.e., the first bank address signal BA<0> of first preliminary bank active control part 131 may be matched with second bank address signal BA<1> of second preliminary bank active control part 132, ACT matched with ACT, PCG matched with PCG, FACT<0> matched with FACT<1>, and ACT_pre<0> matched with ACT_pre<1>, and so on for each preliminary bank active control part.). The first preliminary bank active control part 131 will be described hereinafter, and the description will be applied to the second to eighth preliminary bank active control parts 132 to 138.

The first preliminary bank active control part 131 may enable, latch, and output the first preliminary bank active signal ACT_pre<0> when the active signal ACT and the first bank address BA<0> are enabled, or when the first refresh counting signal FACT<0> is enabled. The first preliminary bank active control part 131 may disable, latch, and output the first preliminary bank active signal ACT_pre<0> when the precharge signal PCG is enabled.

The first preliminary bank active control part 131 may include a fourth NAND gate ND4, fifth to eighth inverters IV5 to IV8, a first NOR gate NOR1, and first and second transistors T1 and T2. The fourth NAND gate ND4 may receive the active signal ACT and the first bank address BA<0>. The fifth inverter IV5 may receive the output signal of the fourth NAND gate ND4. The first NOR gate NOR1 may receive the output signal of the fifth inverter IV5 and the first refresh counting signal FACT<0>. The sixth inverter IV6 may receive the output signal of the first NOR gate NOR1. The gate of the first transistor T1 may receive the output signal of the sixth inverter IV6, and the source of the first transistor T1 may be coupled to a ground voltage VSS. The gate of the second transistor T2 may receive the precharge signal PCG, and the source of the second transistor T2 may receive an external voltage VDD. The drain of the first transistor T1 may be coupled to the drain of the second transistor T2 at, for example, a drain node. The seventh inverter IV7 may receive a signal from the drain node of the first and second transistors T1 and T2, and may output the signal from the drain node as the first preliminary bank active signal ACT_pre<0>. The eighth inverter IV8 may feedback the output signal of the seventh inverter IV7 to the input of the seventh inverter IV7. The first transistor may be implemented with an NMOS transistor, and the second transistor may be implemented with a PMOS transistor.

The second preliminary bank active control part 132 may enable, latch, and output the second preliminary bank active signal ACT_pre<1> when the active signal ACT and the second bank address BA<1> are both enabled, or when the second refresh counting signal FACT<1> is enabled. The second preliminary bank active control part 132 may disable, latch, and output the second preliminary bank active signal ACT_pre<1> when the precharge signal PCG is enabled.

The third preliminary bank active control part 133 may enable, latch, and output the third preliminary bank active signal ACT_pre<2> when the active signal ACT and the third bank address BA<2> are both enabled, or when the third refresh counting signal FACT<2> is enabled. The third preliminary bank active control part 133 may disable, latch, and output the third preliminary bank active signal ACT_pre<2> when the precharge signal PCG is enabled.

The fourth preliminary bank active control part 134 may enable, latch, and output the fourth preliminary bank active signal ACT_pre<3> when the active signal ACT and the fourth bank address BA<3> are both enabled, or when the fourth refresh counting signal FACT<3> is enabled. The fourth preliminary bank active control part 134 may disable, latch, and output the fourth preliminary bank active signal ACT_pre<3> when the precharge signal PCG is enabled.

The fifth preliminary bank active control part 135 may enable, latch, and output the fifth preliminary bank active signal ACT_pre<4> when the active signal ACT and the fifth bank address BA<4> are both enabled, or when the fifth refresh counting signal FACT<4> is enabled. The fifth preliminary bank active control part 135 may disable, latch, and output the fifth preliminary bank active signal ACT_pre<4> when the precharge signal PCG is enabled.

The sixth preliminary bank active control part 136 may enable, latch, and output the sixth preliminary bank active signal ACT_pre<5> when the active signal ACT and the sixth bank address BA<5> are both enabled, or when the sixth refresh counting signal FACT<5> is enabled. The sixth preliminary bank active control part 136 may disable, latch, and output the sixth preliminary bank active signal ACT_pre<5> when the precharge signal PCG is enabled.

The seventh preliminary bank active control part 137 may enable, latch, and output the seventh preliminary bank active signal ACT_pre<6> when the active signal ACT and the seventh bank address BA<6> are both enabled, or when the seventh refresh counting signal FACT<6> is enabled. The seventh preliminary bank active control part 137 may disable, latch, and output the seventh preliminary bank active signal ACT_pre<6> when the precharge signal PCG is enabled.

The eighth preliminary bank active control part 138 may enable, latch, and output the eighth preliminary bank active signal ACT_pre<7> when the active signal ACT and the eighth bank address BA<7> are both enabled, or when the eighth refresh counting signal FACT<7> is enabled. The eighth preliminary bank active control part 138 may disable, latch, and output the eighth preliminary bank active signal ACT_pre<7> when the precharge signal PCG is enabled.

Figure 5:
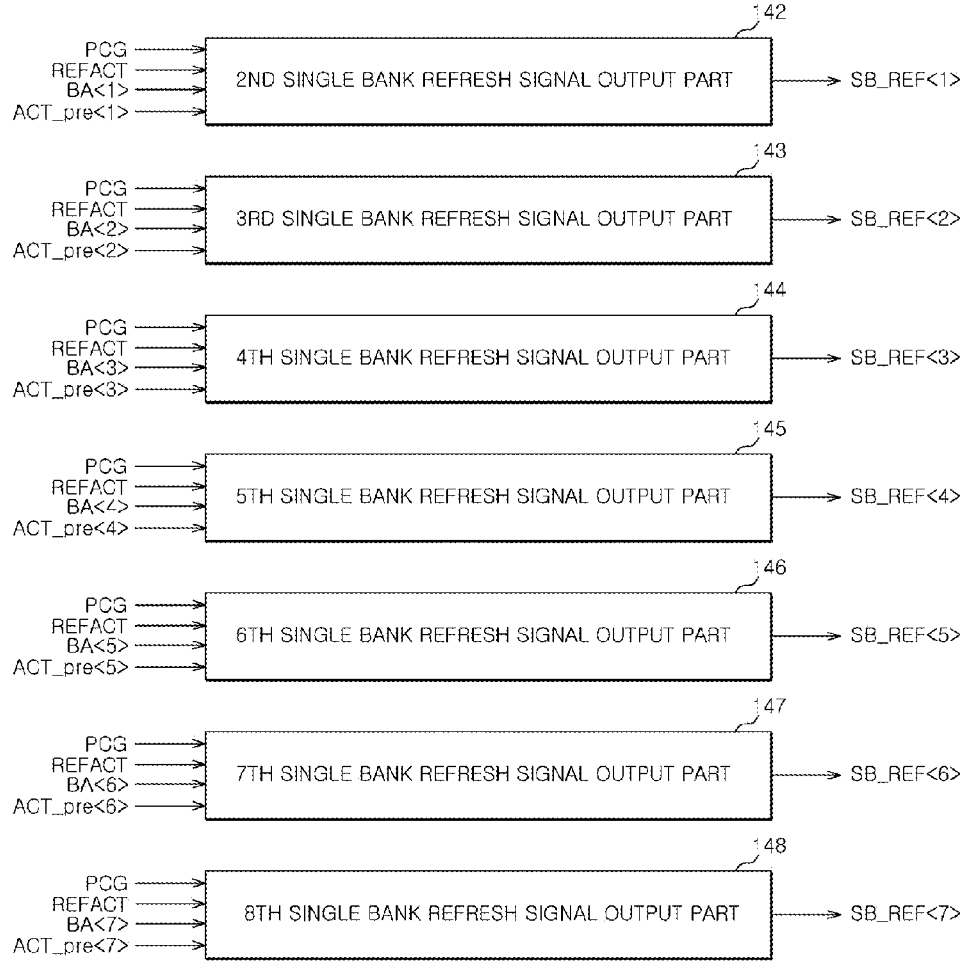
FIG. 5 is a circuit diagram illustrating a representation of a single bank refresh control unit illustrated in FIG. 2.

Referring to FIG. 5, the single bank refresh control unit 140 may include first to eighth single bank refresh signal output parts 141, 142, 143, 144, 145, 146, 147, and 148. The first to eighth single bank refresh signal output parts 141 to 148 may be substantially and may operate substantially the same except that the input and output signals may differ (i.e., the first bank address signal BA<0> of the first single bank refresh signal output part 141 may be matched with the second bank address of the second single bank refresh signal output part 142, PCG matched with PCG, REFACT matched with REFACT, ACT_pre<0> matched with ACT_pre<1>, and SB_REF<0> matched with SB_REF<1>, and so on for each single bank refresh signal output part.). The first single bank refresh signal output part 141 will be described hereinafter, and the description will be applied to the second to eighth single bank refresh signal output parts 142 to 148.

The first single bank refresh signal output part 141 may enable, latch, and output the first single bank refresh signal SB_REF<0> when the single bank refresh command signal REFACT and the first bank address BA<0> are both enabled. When the first preliminary bank active signal ACT_pre<0> is enabled, the first single bank refresh signal output part 141 may prevent the first single bank refresh signal SB_REF<0> from being enabled. That is, the first single bank refresh signal SB_REF<0> may be disabled when the first preliminary bank active signal ACT_pre<0> is enabled.

The first single bank refresh signal output part 141 may include fifth and sixth NAND gates ND5 and ND6, ninth to twelfth inverters IV9, IV10, IV11, and IV12, and third and fourth transistors T3 and T4. The fifth NAND gate ND5 may receive the single bank refresh command signal REFACT and the first bank address BA<0>. The ninth inverter IV9 may receive the output signal of the fifth NAND gate ND5. The gate of the third transistor T3 may receive the output signal of the ninth inverter IV9, and the source of the third transistor T3 may be coupled to the ground voltage VSS. The gate of the fourth transistor T4 may receive the precharge signal PCG, and the source of the fourth transistor T4 may receive the external voltage VDD. The drain of the third transistor may be coupled to the drain of the fourth transistor T4 at, for example, a drain node. The tenth inverter IV10 may receive a signal of the drain node of the third and fourth transistors T3 and T4. The eleventh inverter IV11 may feedback the output signal of the tenth inverter IV10 to the input of the tenth inverter IV10. The sixth NAND gate ND6 may receive the output signal of the tenth inverter IV10 and the first preliminary bank active signal ACT_pre<0>. The twelfth inverter IV12 may receive the output signal of the sixth NAND gate ND6, and may output the first single bank refresh signal SB_REF<0>.

The second single bank refresh signal output part 142 may enable, latch, and output the second single bank refresh signal SB_REF<1> when the single bank refresh command signal REFACT and the second bank address BA<1> are both enabled. When the second preliminary bank active signal ACT_pre<1> is enabled, the second single bank refresh signal output part 142 may prevent the second single bank refresh signal SB_REF<1> from being enabled. That is, the second single bank refresh signal SB_REF<1> may be disabled when the second preliminary bank active signal ACT_pre<1> is enabled.

The third single bank refresh signal output part 143 may enable, latch, and output the third single bank refresh signal SB_REF<2> when the single bank refresh command signal REFACT and the third bank address BA<2> are both enabled. When the third preliminary bank active signal ACT_pre<2> is enabled, the third single bank refresh signal output part 143 may prevent the third single bank refresh signal SB_REF<2> from being enabled. That is, the third single bank refresh signal SB_REF<2> may be disabled when the third preliminary bank active signal ACT_pre<2> is enabled.

The fourth single bank refresh signal output part 144 may enable, latch, and output the fourth single bank refresh signal SB_REF<3> when the single bank refresh command signal REFACT and the fourth bank address BA<3> are both enabled. When the fourth preliminary bank active signal ACT_pre<3> is enabled, the fourth single bank refresh signal output part 144 may prevent the fourth single bank refresh signal SB_REF<3> from being enabled. That is, the fourth single bank refresh signal SB_REF<3> may be disabled when the fourth preliminary bank active signal ACT_pre<3> is enabled.

The fifth single bank refresh signal output part 145 may enable, latch, and output the fifth single bank refresh signal SB_REF<4> when the single bank refresh command signal REFACT and the fifth bank address BA<4> are both enabled. When the fifth preliminary bank active signal ACT_pre<4> is enabled, the fifth single bank refresh signal output part 145 may prevent the fifth single bank refresh signal SB_REF<4> from being enabled. That is, the fifth single bank refresh signal SB_REF<4> may be disabled when the fifth preliminary bank active signal ACT_pre<4> is enabled.

The sixth single bank refresh signal output part 146 may enable, latch, and output the sixth single bank refresh signal SB_REF<5> when the single bank refresh command signal REFACT and the sixth bank address BA<5> are both enabled. When the sixth preliminary bank active signal ACT_pre<5> is enabled, the sixth single bank refresh signal output part 146 may prevent the sixth single bank refresh signal SB_REF<5> from being enabled. That is, the sixth single bank refresh signal SB_REF<5> may be disabled when the sixth preliminary bank active signal ACT_pre<5> is enabled.

The seventh single bank refresh signal output part 147 may enable, latch, and output the seventh single bank refresh signal SB_REF<6> when the single bank refresh command signal REFACT and the seventh bank address BA<6> are both enabled. When the seventh preliminary bank active signal ACT_pre<6> is enabled, the seventh single bank refresh signal output part 147 may prevent the seventh single bank refresh signal SB_REF<6> from being enabled. That is, the seventh single bank refresh signal SB_REF<6> may be disabled when the seventh preliminary bank active signal ACT_pre<6> is enabled.

The eighth single bank refresh signal output part 141 may enable, latch, and output the eighth single bank refresh signal SB_REF<7> when the single bank refresh command signal REFACT and the eighth bank address BA<7> are both enabled. When the eighth preliminary bank active signal ACT_pre<7> is enabled, the eighth single bank refresh signal output part 141 may prevent the eighth single bank refresh signal SB_REF<7> from being enabled. That is, the eighth single bank refresh signal SB_REF<7> may be disabled when the eighth preliminary bank active signal ACT_pre<7> is enabled.

Figure 6:
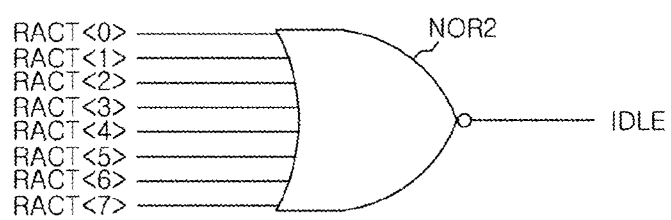
FIG. 6 is a representation of a bank activation decision unit illustrated in FIG. 2.

Referring to FIG. 6, the bank activation decision unit 150 may include a second NOR gate NOR2. The second NOR gate NOR2 may receive the first to eighth bank active signals RACT<0>, RACT<1>, RACT<2>, RACT<3>, RACT<4>, RACT<5>, RACT<6>, and RACT<7>, and may output the idle signal IDLE. The second NOR gate NOR2 may enable the idle signal IDLE to a logic high level when all of the first to eighth bank active signals RACT<0:7> are disabled to a logic low level. The second NOR gate NOR2 may disable to a logic low level when one or more of the first to eighth bank active signals RACT<0:7> are enabled to a logic high level.

The operation of a semiconductor memory apparatus in accordance with an embodiment of the present disclosure will be described hereinafter.

Referring to FIG. 2, the command decoder 110 may generate the active signal ACT, the refresh signal REF, and the precharge signal PCG by decoding the command CMD.

First, during the active operation, the command decoder 110 may enable the active signal ACT by decoding the command CMD.

When the active signal ACT is enabled, the bank active control unit 130 may generate the first to eighth preliminary bank active signals ACT_pre<0:7> in response to the first to eighth bank addresses BA<0:7>. For example, the bank active control unit 130 may output the first to eighth bank addresses BA<0:7> as the first to eighth preliminary bank active signals ACT_pre<0:7> when the active signal ACT is enabled.

The signal combination portion 200 illustrated in FIG. 1 may output the first to eighth preliminary bank active signals ACT_pre<0:7> as the first to eighth bank active signals RACT<0:7>. The first to eighth banks 301 to 308 may be selectively activated in response to the first to eighth bank active signals RACT<0:7>.

Secondly, during the refresh operation, the command decoder 110 may enable the refresh signal REF by decoding the command CMD.

During the refresh operation, the refresh decision unit 120 may select either the all bank refresh operation or the single bank refresh operation in response to the refresh control signal REF_c. The refresh decision unit 120 may prevent performing the all bank refresh operation when one or more of the first to eighth banks 301 to 308 are activated. For example, the refresh decision unit 120 may enable the all bank refresh command signal AFACT when the refresh signal REF, the refresh control signal REF_c, and the idle signal IDLE are all enabled. The refresh decision unit 120 may disable the all bank refresh command signal AFACT when the idle signal IDLE is disabled even though the refresh signal REF and the refresh control signal REF_c are enabled. The idle signal IDLE may be generated by the bank activation decision unit 150. The bank activation decision unit 150 may enable the idle signal IDLE when all of the first to eighth bank active signals RACT<0:7> are disabled, that is, when all of the first to eighth banks 301 to 308 are deactivated. The bank activation decision unit 150 may disable the idle signal IDLE when one or more of the first to eighth bank active signals RACT<0:7> are enabled, that is, when one or more of the first to eighth banks 301 to 308 are activated.

When the all bank refresh command signal AFACT is disabled, the refresh counter 160 may not operate, and the all bank refresh operation may not be performed.

The all bank refresh operation, which is performed when the all bank refresh command signal AFACT is enabled, will be described hereinafter.

When the all bank refresh command signal AFACT is enabled, the refresh counter 160 may count and sequentially enable the first to eighth refresh counting signals FACT<0:7>.

The bank active control unit 130 (see FIGS. 2 and 4) may generate the first to eighth preliminary bank active signals ACT_pre<0:7> in response to the first to eighth refresh counting signals FACT<0:7> during the all bank refresh operation. For example, the bank active control unit 130 may output the first to eighth refresh counting signals FACT<0:7> as the first to eighth preliminary bank active signals ACT_pre<0:7> during the all bank refresh operation.

The signal combination portion 200 may output the first to eighth preliminary bank active signals ACT_pre<0:7> as the first to eighth bank active signals RACT<0:7>. The first to eighth banks 301 to 308 may be selectively activated in response to the first to eighth bank active signals RACT<0:

7>. That is, the first to eighth banks 301 to 308 may sequentially activated in response to the first to eighth refresh counting signals FACT<0:7>, which are counted during the all bank refresh operation, the semiconductor memory apparatus may perform the all bank refresh operation.

During the single bank refresh operation, the refresh decision unit 120 may enable the single bank refresh command signal REFACT. For example, the refresh decision unit 120 may enable the single bank refresh command signal REFACT when the refresh signal REF is enabled, and the refresh control signal REF_c is disabled.

The single bank refresh control unit 140 may output the first to eighth bank addresses BA<0:7> as the first to eighth single bank refresh signals SB_REF<0:7> when the single bank refresh command signal REFACT is enabled. When one or more of the first to eighth preliminary bank active signals ACT_pre<0:7> are enabled, the single bank refresh control unit 140 may prevent the corresponding one of the first to eighth single bank refresh signals SB_REF<0:7> from being enabled. For example, the single bank refresh control unit 140 may enable the first single bank refresh signal SB_REF<0> when the single bank refresh command signal REFACT is enabled, and the first bank address BA<0> of the first to eighth bank addresses BA<0:7> is enabled. The single bank refresh control unit 140 may prevent the first single bank refresh signal SB_REF<0> from being enabled, and the first single bank refresh signal SB_REF<0> may be disabled when the first preliminary bank active signal ACT_pre<0> is enabled. The single bank refresh control unit 140 may enable the first single bank refresh signal SB_REF<0> when the single bank refresh command signal REFACT is enabled, the first bank address BA<0> is enabled, and the second to eighth preliminary bank active signals ACT_pre<1:7> excluding the first preliminary bank active signal ACT_pre<0> are enabled.

During the single bank refresh operation, the single bank refresh command signal REFACT, which directs the single bank refresh operation to the already-activated bank, may be prevented.

In accordance with various examples of embodiments of the present disclosure, the semiconductor memory apparatus may perform the all bank refresh operation only when all of the banks are deactivated, and may prevent the single bank refresh command signal, which directs activation of an already-activated bank.

Figure 7:
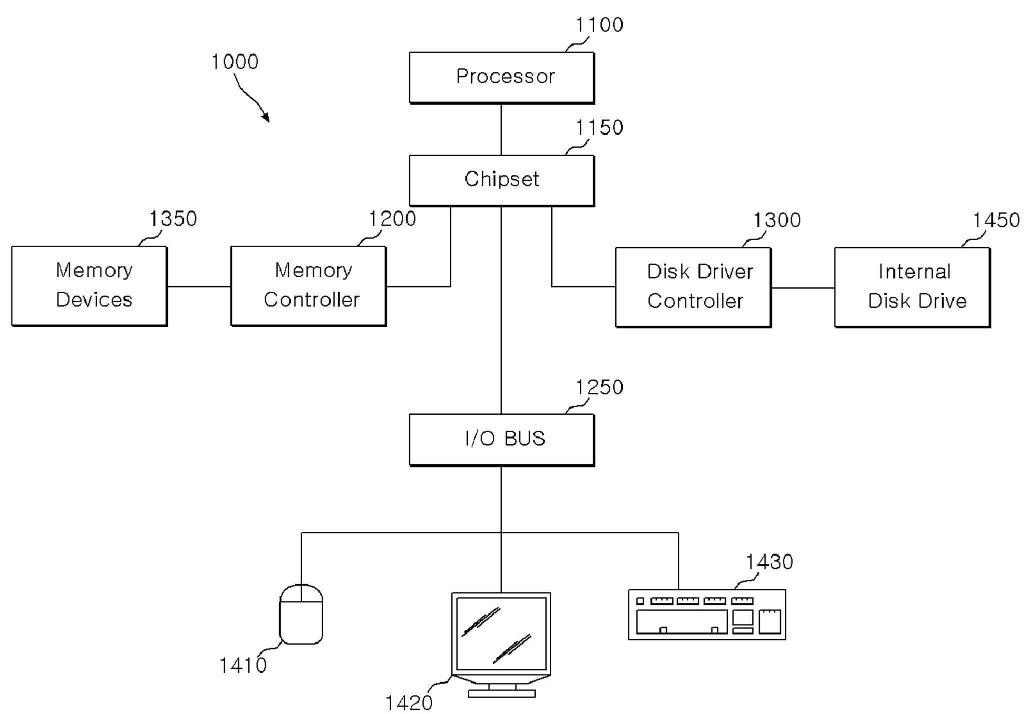
FIG. 7 illustrates a block diagram representation of an example of a system employing the semiconductor memory apparatus in accordance with the embodiments discussed above with relation to FIGS. 1-6.

The semiconductor memory apparatus discussed above is particular useful in the design of memory devices, processors, and computer systems. For example, referring to FIG. 7, a block diagram of a system employing the semiconductor memory apparatus in accordance with the embodiments are illustrated and generally designated by a reference numeral 1000. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented.

A chipset 1150 may be operably coupled to the CPU 1100. The chipset 1150 is a communication pathway for signals between the CPU 1100 and other components of the system 1000, which may include a memory controller 1200, an input/output ("I/O") bus 1250, and a disk drive controller 1300. Depending on the configuration of the system, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be operably coupled to the chipset 1150. The memory controller 1200 may include at least one semiconductor memory apparatus as discussed above with reference to FIGS. 1-6. Thus, the memory controller 1200 can receive a request provided from the CPU 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the semiconductor memory apparatus as discussed above with relation to FIGS. 1-6, the memory devices 1350 may include a plurality of word lines and a plurality of bit lines for defining a plurality of memory cell. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 (i.e., internal disk drive) may also be operably coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

It is important to note that the system 1000 described above in relation to FIG. 7 is merely one example of a system employing the semiconductor memory apparatus as discussed above with relation to FIGS. 1-6. In alternate embodiments, such as cellular phones or digital cameras, the components may differ from the embodiments illustrated in FIG. 7.

While various embodiments have been described above, it will be understood to those skilled in the art that the embodiments described are by way of example only. Accordingly, the semiconductor memory apparatus should not be limited based on the described embodiments. Rather, the semiconductor memory apparatus described herein should only be limited in light of the claims that follow when taken in conjunction with the above description and accompanying drawings.

What is claimed is:

1. A semiconductor memory apparatus comprising:

an active control portion configured to generate a preliminary bank active signal and a single bank refresh signal in response to a command, a refresh control signal, and a bank active signal; and a signal combination portion configured to enable the bank active signal when either the preliminary bank active signal or the single bank refresh signal is enabled.

2. The semiconductor memory apparatus of claim 1, wherein the signal combination portion is configured to enable the bank active signal when both the preliminary bank active and the single bank refresh signals are enabled.

3. The semiconductor memory apparatus of claim 2, wherein the active control portion selects either an all bank refresh operation or a single bank refresh operation in response to the refresh control signal, and enables either the preliminary bank active signal or the single bank refresh signal according to the result of the selection after receiving the command, wherein the command initiates the semiconductor memory apparatus to perform the refresh operation.

4. The semiconductor memory apparatus of claim 3, wherein the active control portion enables the preliminary bank active signal during the all bank refresh operation, and enables the single bank refresh signal during the single bank refresh operation.

5. The semiconductor memory apparatus of claim 4, wherein the active control portion prevents the preliminary bank active signal from being enabled when the bank active signal is enabled even though the active control portion selects the all bank refresh operation.

6. The semiconductor memory apparatus of claim 5, wherein the active control portion comprises:

a command decoder configured to decode the command and generate a refresh signal;

a refresh decision unit configured to select either the all bank refresh operation or the single bank refresh operation in response to both the refresh signal and the refresh control signal, and configured to prevent the preliminary bank active signal from being enabled during the all bank refresh operation in response to an idle signal; and a bank activation decision unit configured to generate the idle signal according to whether the bank active signal is enabled or disabled.

7. A semiconductor memory apparatus comprising:

a plurality of banks; and an active control portion configured to select either a refresh operation or an active operation in response to a command, configured to select either an all bank refresh operation or a single bank refresh operation in response to a refresh control signal during the refresh operation, and configured to prevent performing the all bank refresh operation when one or more of the plurality of banks are activated.

8. The semiconductor memory apparatus of claim 7, wherein the all bank refresh operation refreshes all of the plurality of banks, and the single bank refresh operation refreshes one of the plurality of banks.

9. The semiconductor memory apparatus of claim 8, wherein the active control portion performs the single bank refresh operation when an activated one of the plurality of the banks, and a bank to be refreshed among the plurality of the banks are different to each other during the single bank refresh operation, and wherein the active control portion prevents performing the single bank refresh operation when an activated one of the plurality of the banks, and a bank to be refreshed among the plurality of the banks are the same during the single bank refresh operation.

10. The semiconductor memory apparatus of claim 9, wherein the active control portion generates a plurality of preliminary bank active signals and a plurality of single bank refresh signals in response to the command, the refresh control signal, a plurality of bank addresses, and a plurality of bank active signals.

11. The semiconductor memory apparatus of claim 10, wherein the plurality of banks are activated in response to the plurality of bank active signals, and further comprising a signal combination portion configured to output the plurality of preliminary bank active signals as the plurality of bank active signals, or output the plurality of single bank refresh signals as the plurality of bank active signals.

12. The semiconductor memory apparatus of claim 11, wherein the active control portion comprises:

a command decoder configured to decode the command and generate an active signal, a refresh signal, and a precharge signal depending on the command;

a refresh decision unit configured to enable either an all bank refresh command signal or a single bank refresh command signal in response to the refresh signal, the refresh control signal, and an idle signal;

a bank active control unit configured to generate the plurality of preliminary bank active signals in response to the active signal, the plurality of bank addresses, a plurality of refresh counting signals, and the precharge signal;

a single bank refresh control unit configured to generate the plurality of single bank refresh signals in response to the single bank refresh command signal, the plurality of bank addresses, and the plurality of preliminary bank active signals;

a bank activation decision unit configured to generate the idle signal in response to the plurality of bank active signals; and a refresh counter configured to count the plurality of refresh counting signals in response to the all bank refresh command signal.

13. The semiconductor memory apparatus of claim 12, wherein the refresh decision unit enables the all bank refresh command signal when the refresh signal, the refresh control signal, and the idle signal are all enabled, and wherein the refresh decision unit enables the single bank refresh command signal when the refresh signal is enabled, and the refresh control signal is disabled.

14. The semiconductor memory apparatus of claim 12, wherein the bank active control unit latches and outputs the plurality of bank addresses as the plurality of preliminary bank active signals when the active signal is enabled, wherein the bank active control unit latches and outputs the plurality of refresh counting signals as the plurality of preliminary bank active signals when the plurality of refresh counting signals are counted, and wherein the bank active control unit initializes all of the plurality of preliminary bank active signals, which are latched, when the precharge signal is enabled.

15. The semiconductor memory apparatus of claim 12, wherein the single bank refresh control unit latches and outputs the plurality of bank addresses as the plurality of single bank refresh signals when the single bank refresh command signal is enabled, and wherein the single bank refresh control unit disables one of the plurality of single bank refresh signals, which is inputted to the same bank that an enabled one of the plurality of preliminary bank active signals is inputted.

16. The semiconductor memory apparatus of claim 12, wherein the bank activation decision unit enables the idle signal when all of the plurality of bank active signals are disabled, and wherein the bank activation decision unit disables the idle signal when one or more of the plurality of bank active signals are enabled.

17. A semiconductor memory apparatus comprising:

a bank active control unit configured to generate a preliminary bank active signal in response to a bank address during an active operation; and a single bank refresh control unit configured to select a single bank according to the bank address, enable a single bank refresh signal when the single bank is to be refreshed, wherein the single bank refresh control unit disables the single bank refresh signal when the single bank to be refreshed is activated, wherein the preliminary bank active signal activates a bank, and wherein the single bank refresh signal commands a refresh operation.

18. The semiconductor memory apparatus of claim 17, wherein the single bank refresh control unit outputs the bank address as the single bank refresh signal when a single bank refresh command signal is enabled, and wherein the single bank refresh control unit prevents the single bank refresh signal from being enabled in response to the preliminary bank active signal.

19. The semiconductor memory apparatus of claim 18, wherein the single bank refresh control unit prevents the single bank refresh signal from being enabled when the bank address, which indicates a bank corresponding to the preliminary bank active signal that is enabled, is received.

* * * * *